United States Patent [19]

Yamaguchi et al.

[11] Patent Number: 4,672,647
[45] Date of Patent: Jun. 9, 1987

[54] SERIAL DATA TRANSFER CIRCUITS FOR DELAYED OUTPUT

[75] Inventors: Akira Yamaguchi, Nara; Setsufumi Kamuro, Yamatokoriyama; Jitsuo Sakamoto, Nara, all of Japan

[73] Assignee: Sharp Kabushiki Kaisha, Osaka, Japan

[21] Appl. No.: 740,219

[22] Filed: Jun. 3, 1985

[30] Foreign Application Priority Data

Jun. 8, 1984 [JP] Japan .............................. 59-85812[U]
Jun. 8, 1984 [JP] Japan .............................. 59-85813[U]
Jun. 8, 1984 [JP] Japan .............................. 59-85814[U]

[51] Int. Cl.4 ............................................. G11C 19/00
[52] U.S. Cl. ....................................... 377/77; 377/67; 377/70; 377/107; 328/105
[58] Field of Search ................... 377/77, 67, 70, 107; 328/105, 153, 137; 307/602, 242, 243, 481

[56] References Cited

U.S. PATENT DOCUMENTS 3,972,034 7/1976 Derickson, III et al. ............ 377/67
4,263,583 4/1981 Wyckoff .............................. 328/162
4,353,057 10/1982 Bernet et al. ........................ 328/151

Primary Examiner—Stanley D. Miller
Assistant Examiner—K. Ohralik
Attorney, Agent, or Firm—Flehr, Hohbach, Test, Albritton & Herbert

[57] ABSTRACT

A power-saving serial data transfer circuit for outputting an inputted digital data signal through a plurality of serially connected shift register cells comprises n ($=m \times k$) cells in k groups each containing m serially connected cells. A digital data signal is applied commonly to the first-stage cells of the groups and inputted in a time-wise segmented sequence to the cells by shift pulses with different phases. The inputted data signal is shifted through the cells within the same groups and is inputted to the last-stage cells of the groups. The inputted data signal is also outputted through a multiplexer connected to the last stage cells.

6 Claims, 21 Drawing Figures

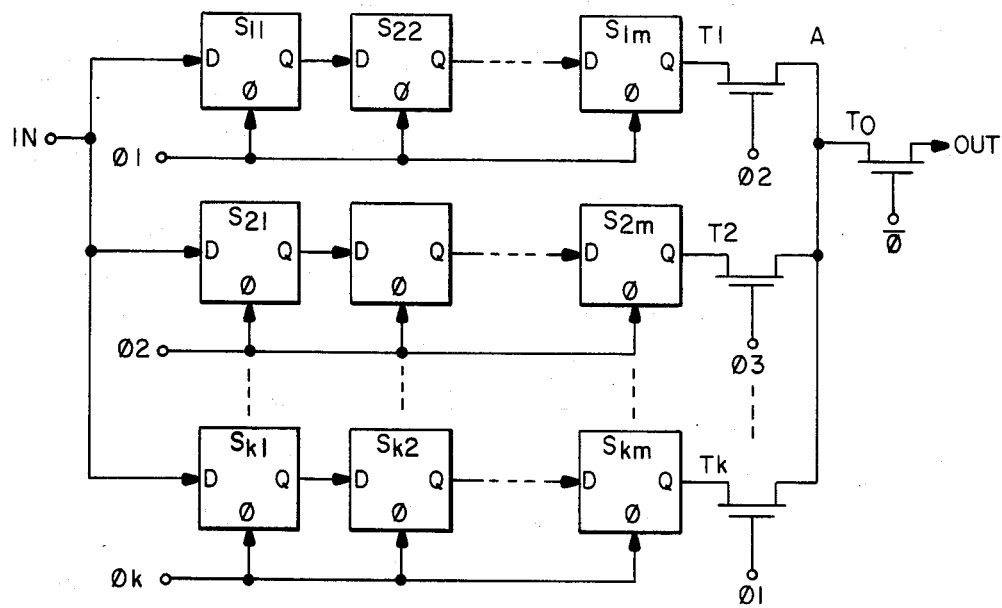
FIG.—1a
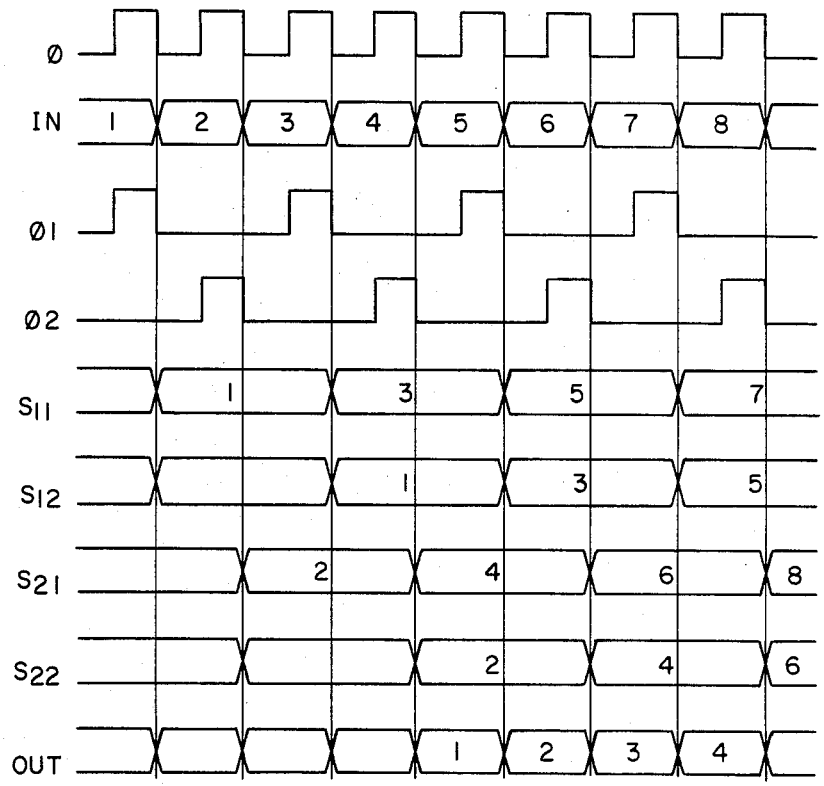
FIG.—1b

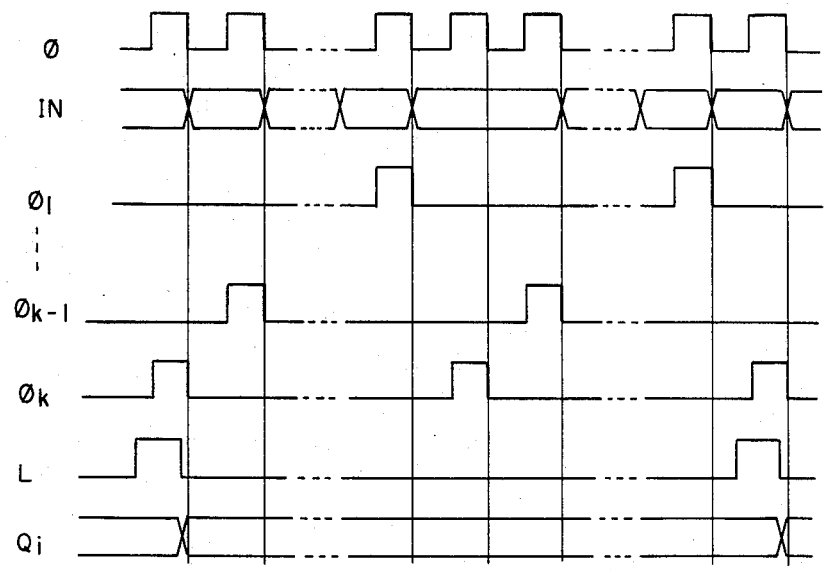
FIG.—2b
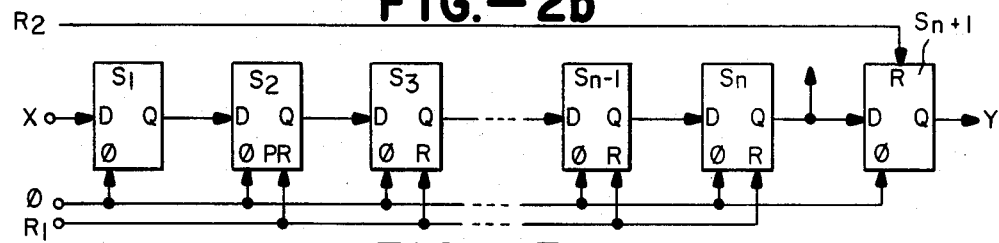
FIG.—3a
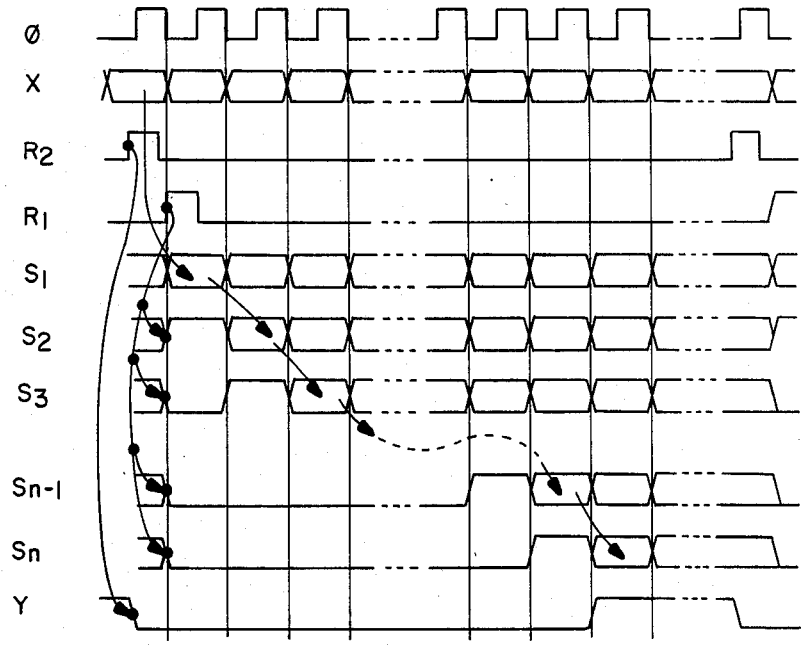
FIG.—3b

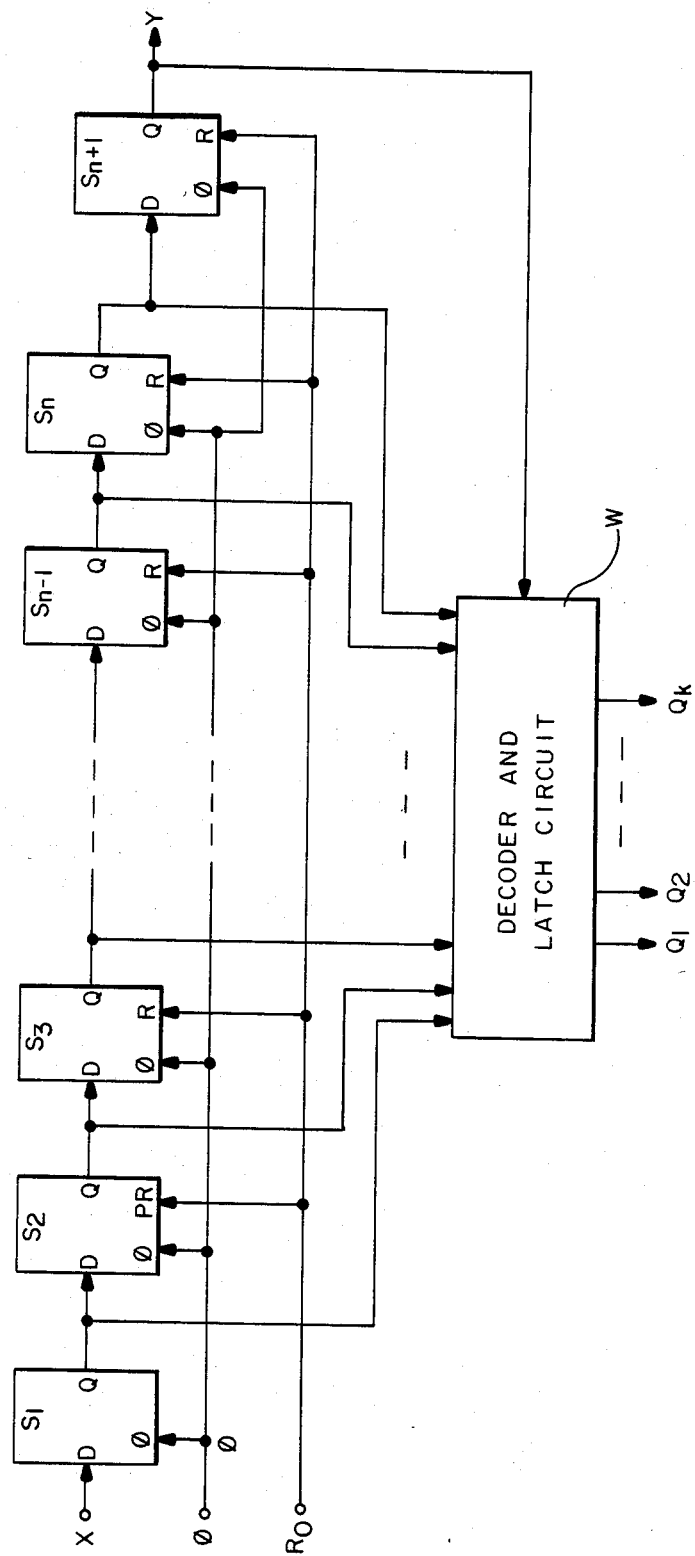
FIG. — 5

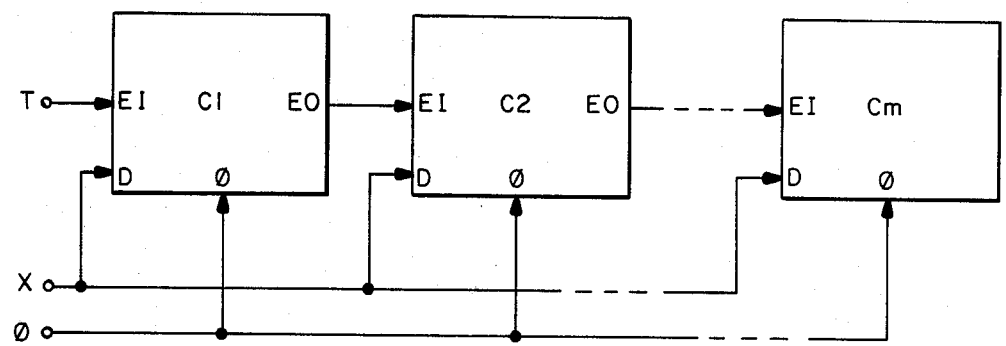
FIG.—6a
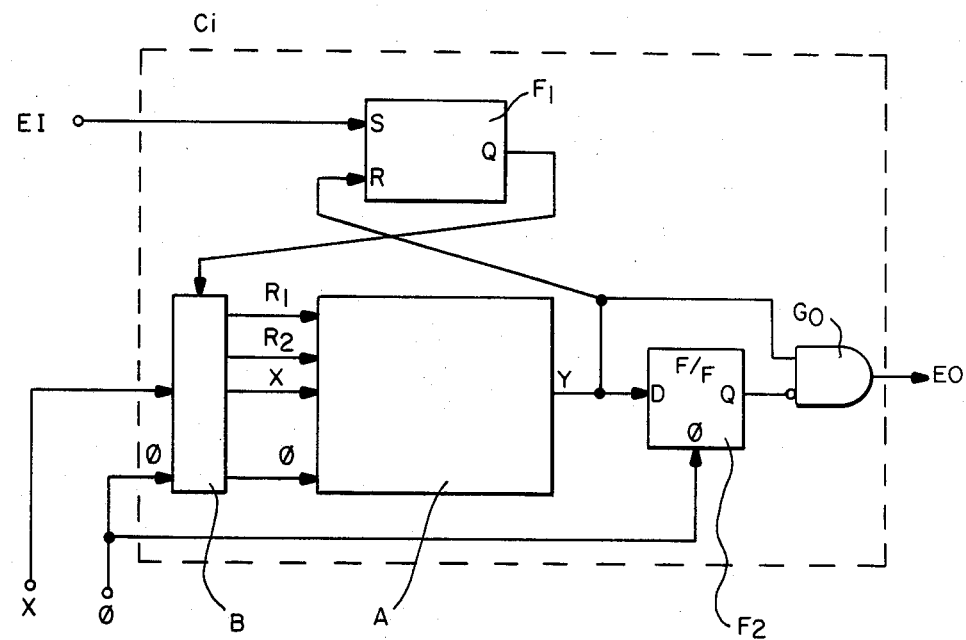
FIG.—6b

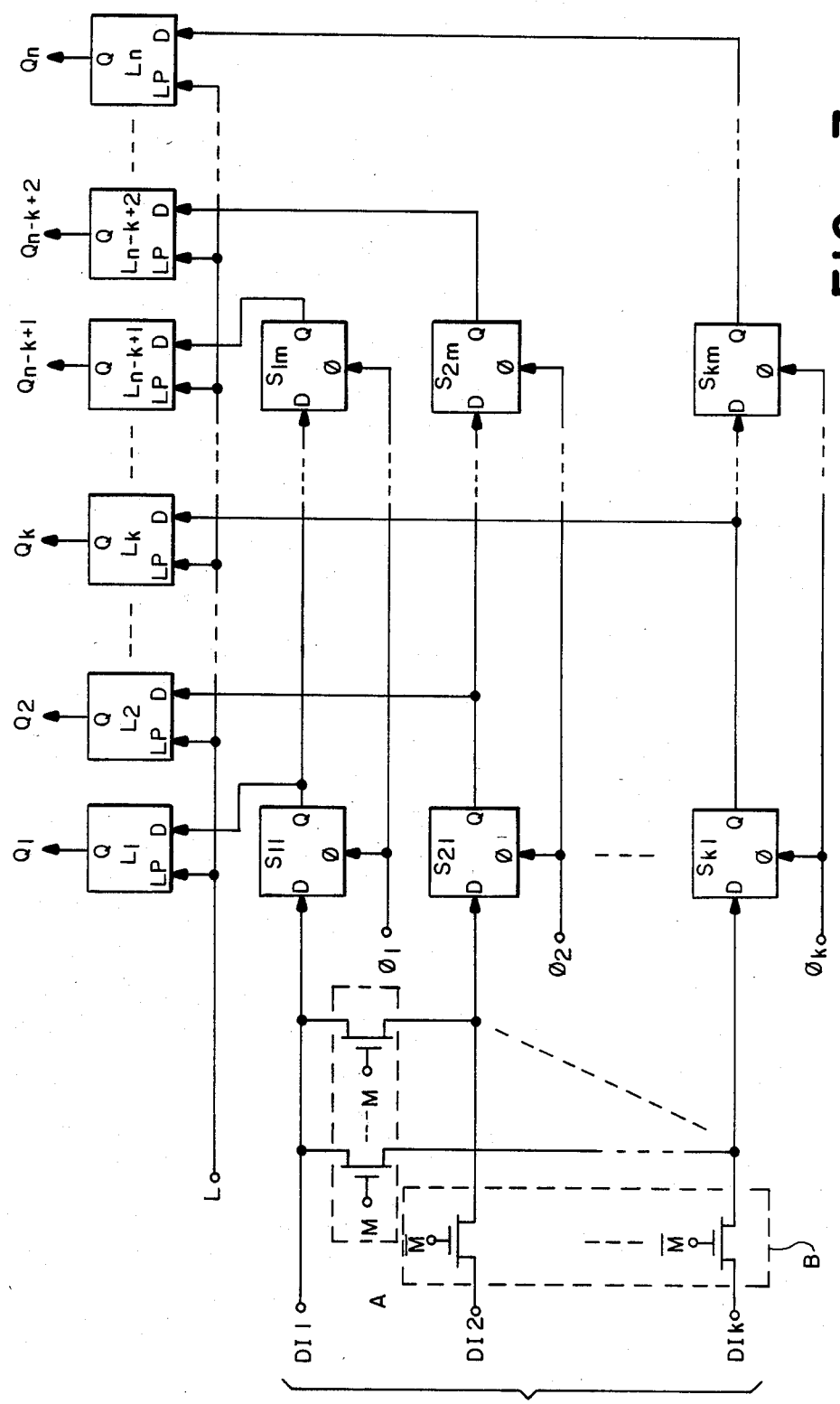
FIG.—7a

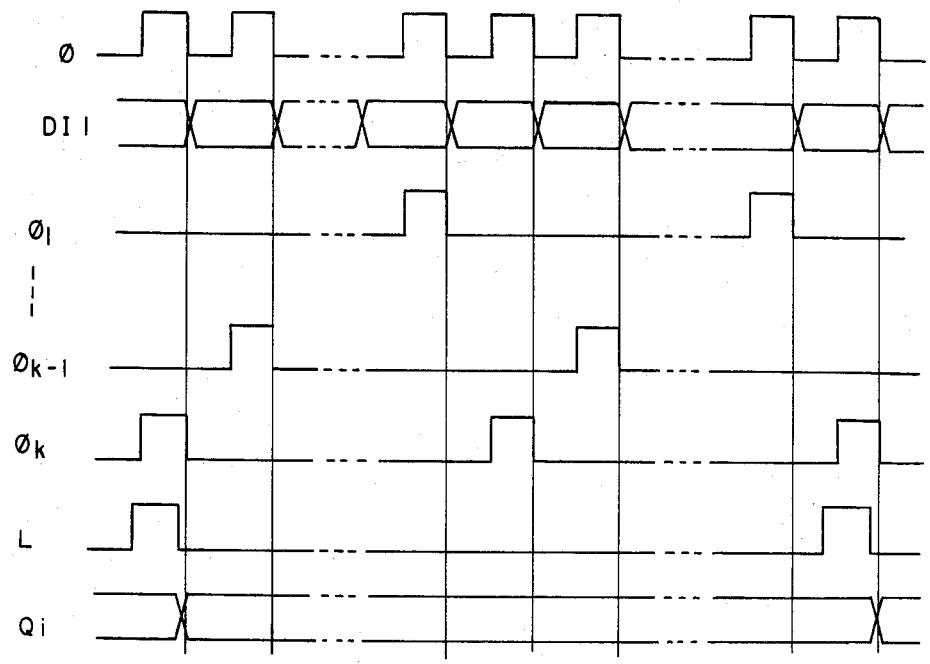
FIG.—7b
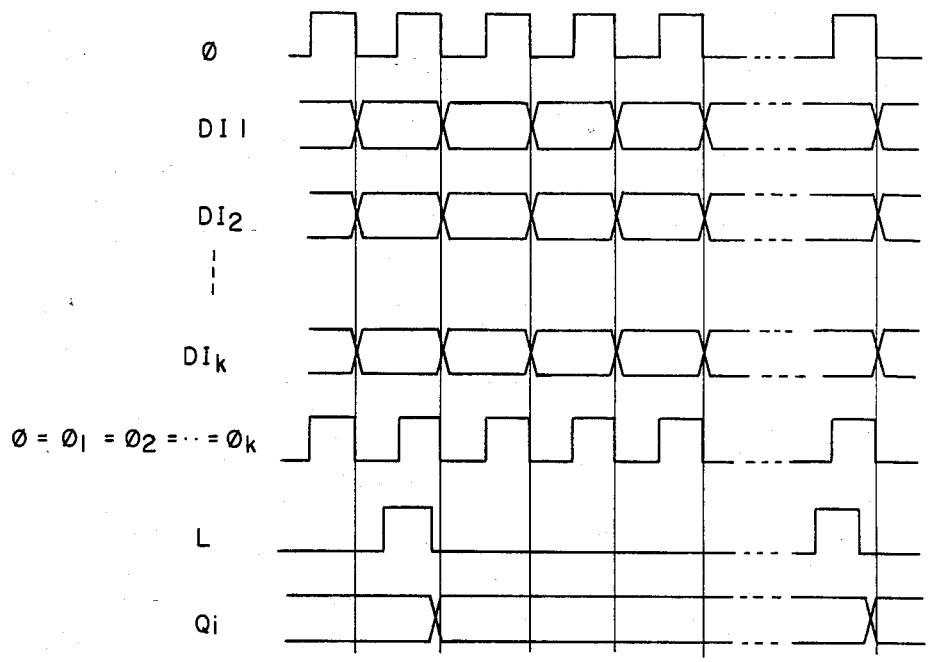
FIG.—7c

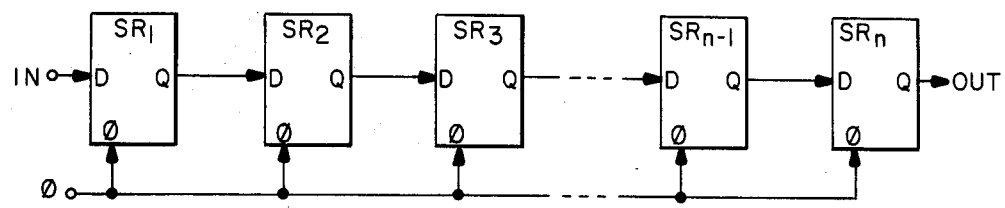
FIG.—8a PRIOR ART
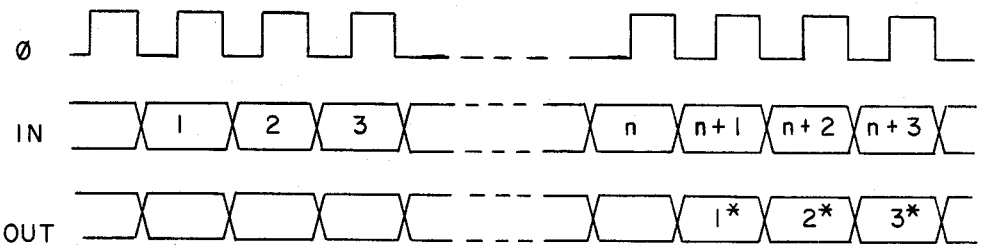
FIG.—8b PRIOR ART
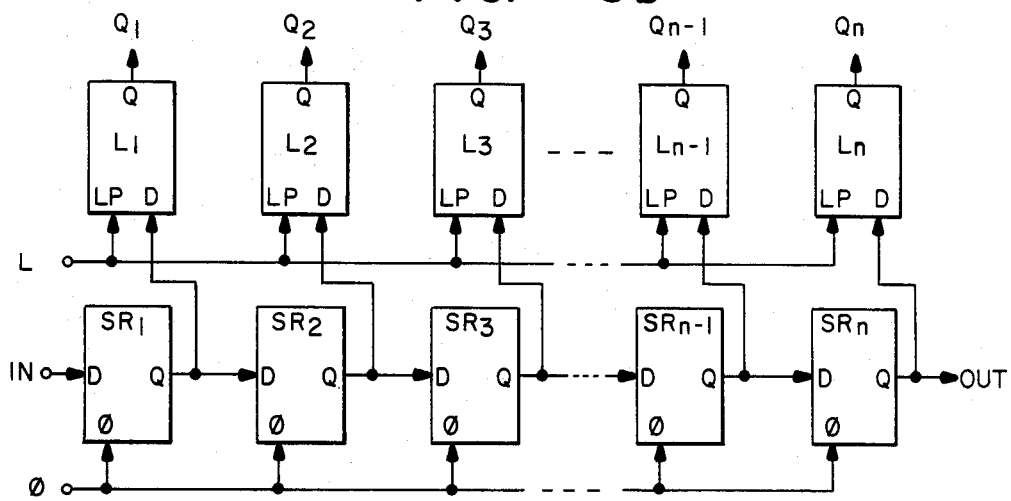
FIG.—9a PRIOR ART
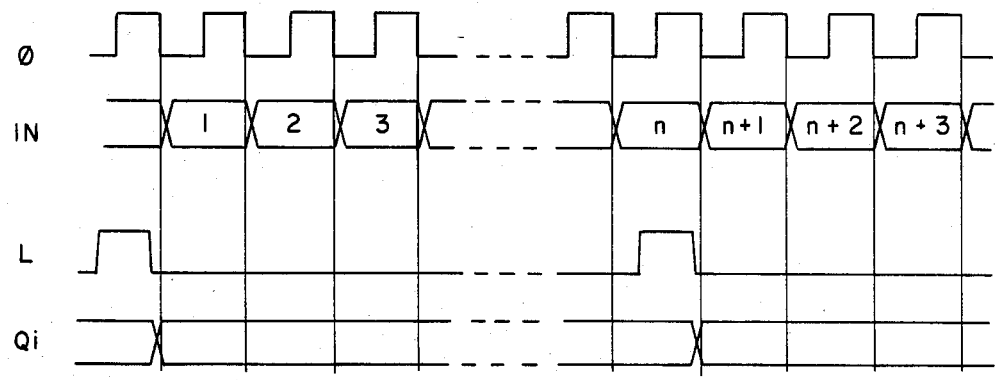
FIG.—9b PRIOR ART

SERIAL DATA TRANSFER CIRCUITS FOR DELAYED OUTPUT

This invention relates to improvements in serial data transfer circuits and more particularly to an improved serial data transfer circuit adapted to output inputted data with a specified delay time period.

When signals are processed by various types of logical circuits, it frequently becomes necessary to obtain a signal delayed, for example, by a specified number (n) of clock periods. Circuits with a serially connected bystable stages, or cells have been used conventionally as such a signal processing circuit. FIG. 8(a) is a conventional type of data transfer circuit connecting n cells $SR_1$-$SR_n$ serially. Input data signal IN is sequentially shifted in synchronism with a shift clock $\phi$ inputted to the individual cells, and serial data transfer is accomplished by outputting the aforementioned input data signal with a delay by (n+1) periods of the shift clock. FIG. 8(b) is a timing chart for the circuit of FIG. 8(a).

As another example, FIG. 9(a) shows a circuit which not only causes an input data signal to delay by n clock periods through n cells $SR_1$-$SR_n$ but also allows the delayed signal to be taken out in parallel. There are provided n latch circuits $L_1$-$L_n$ to receive the outputs of the individual cells $SR_1$-$SR_n$ as shown. After transfers by n clock pulses, the output signals of the cells $SR_1$-$SR_n$ are latched respectively to the n latch circuits $L_1$-$L_n$ by a latch pulse L and output signals $Q_1$-$Q_n$ are derived from these latched circuits $L_1$-$L_n$. A serial data signal can also be outputted from an output terminal. A new data signal may subsequently be inputted from the first-stage cell $SR_1$ serially into this circuit after the latching described above is completed. The same operation is repeated as described above and the signal will be outputted in parallel. FIG. 9(b) is a timing chart for the transfer operation described above.

Each of the cells in the conventional data transfer circuits described above can be constructed as shown in FIG. 10 by using inverters $I_1$-$I_4$ and transfer gates $X_1$-$X_4$. In the case of an integrated circuit comprising CMOS transistors, each inverter $I_1$-$I_4$ is usually constructed by using CMOS transistors $T_{r1}$ and $T_{r2}$ shown in FIG. 11.

Power consumption in such a CMOS circuit is generally determined by the frequency of charging and discharging of the load capacitors. Let us consider the power consumption of a CMOS circuit by using FIG. 11. Let us assume that the transistors $T_{r1}$ and $T_{r2}$ are a p-channel MOS transistor and an n-channel MOS transistor, respectively. Then, the power consumption P can be expressed as $P = CV_{DD}^2 f$ where C is the load capacitance, $V_{DD}$ is the source voltage and f is the inversion frequency of the output stage. This means that the power consumption increases as the inversion frequency f increases, and that the main advantage of using CMOS circuits, which is to lower power consumption, is not going to be gained.

FIG. 12(a) is a conventional serial-to-parallel conversion circuit for a k-bit input and FIG. 12(b) is a timing chart for explaining the operation of this circuit. A conversion circuit of this type is generally composed of k groups of m-stage cells $S_{i1}$-$S_{im}$ (i=1-k) with n(=m×k) latch circuits $L_1$-$L_n$ individually connected to the output terminal of each shift register. When a k-bit input data signal $DI_1$-$DI_k$ is applied to the first cells $S_{i1}$ (i=1-k) and inputted to the cells by a shift pulse $\phi$, information in each bit is sequentially transferred through the cells within the same group in synchronism with the shift pulse $\phi$ which is applied to all cells in common. When a latch pulse L is given the data signals being transferred through cells are latched to the latch circuits $L_1$-$L_n$ and taken out as an output signal from the output terminals $Q_1$-$Q_n$. A circuit like this, however, cannot take out a serially inputted 1-bit data signal as a parallel output. With all the cells in multiple rows, it must be concluded that the circuit is not effectively utilized.

It is therefore an object of the present invention to provide a serial data transfer circuit of a power-saving design without adversely affecting its data transfer capabilities.

It is another object of the present invention to provide a serial data transfer circuit to which an automatic counting function can be provided with a simple additional structure.

It is a further object of the present invention to provide a serial-to-parallel conversion circuit which, with the addition of a simple switching circuit, can make use of shift registers more effectively.

FIG. 1(a) is a block diagram of a serial data transfer circuit according to an embodiment of the present invention and FIG. 1(b) is a timing chart for the operation of this circuit.

FIG. 2(a) and FIG. 2(b) are respectively a block diagram and a timing chart of a serial data transfer circuit according to another embodiment of the present invention.

FIG. 3(a) and FIG. 3(b) are respectively a block diagram and a timing chart of a circuit according to still another embodiment of the present invention.

FIG. 5 is a block circuit diagram according to a still further embodiment of the present invention.

FIG. 6(a) is a block diagram showing an example of application of the present invention. FIG. 6(b) is a block diagram of a unit circuit of FIG. 6(a).

FIG. 7(a) is a block circuit diagram according to still another embodiment of the present invention. FIG. 7(b) and FIG. 7(c) are timing charts for explaining this circuit.

FIG. 8(a) and FIG. 8(b) are respectively a block diagram and a timing chart of a conventional data transfer circuit.

FIG. 9(a) and FIG. 9(b) are respectively a block diagram and a timing chart of another conventional data transfer circuit.

Figure 10:
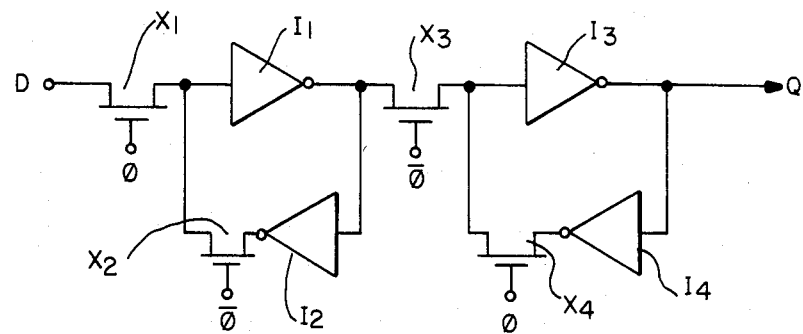

FIG. 10 is a block diagram of a cell circuit including inverters.

Figure 11:
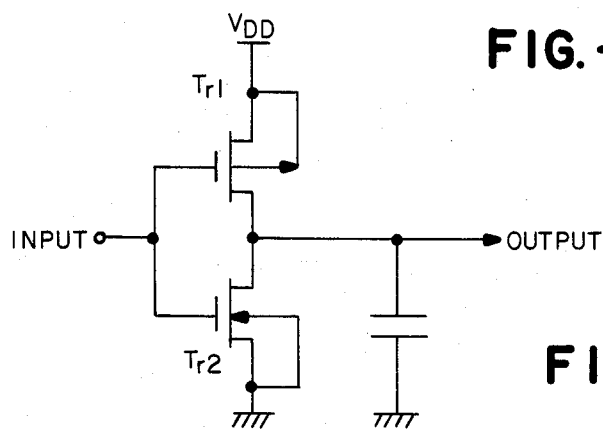

FIG. 11 is a CMOS circuit diagram of a cell.

Figure 12B:
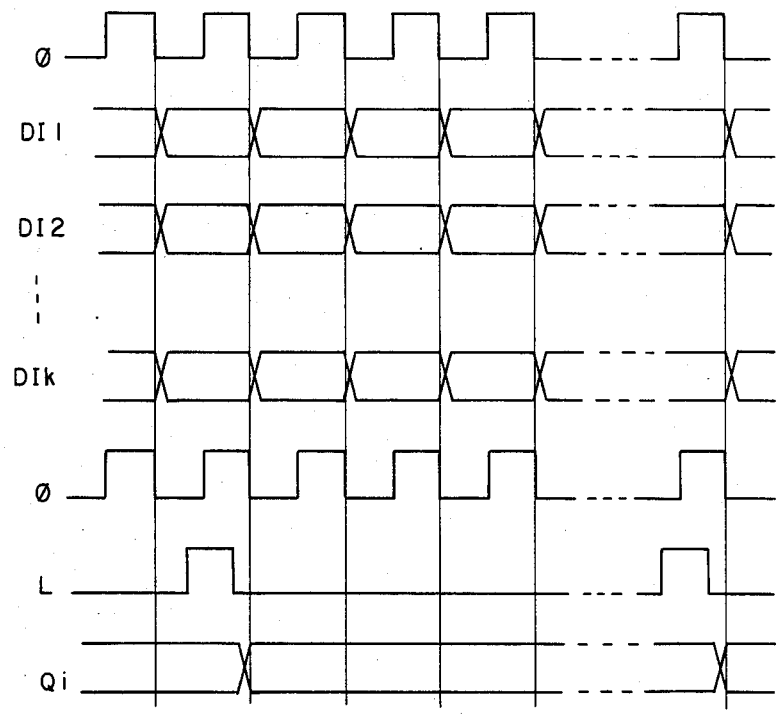
Figure 12A:
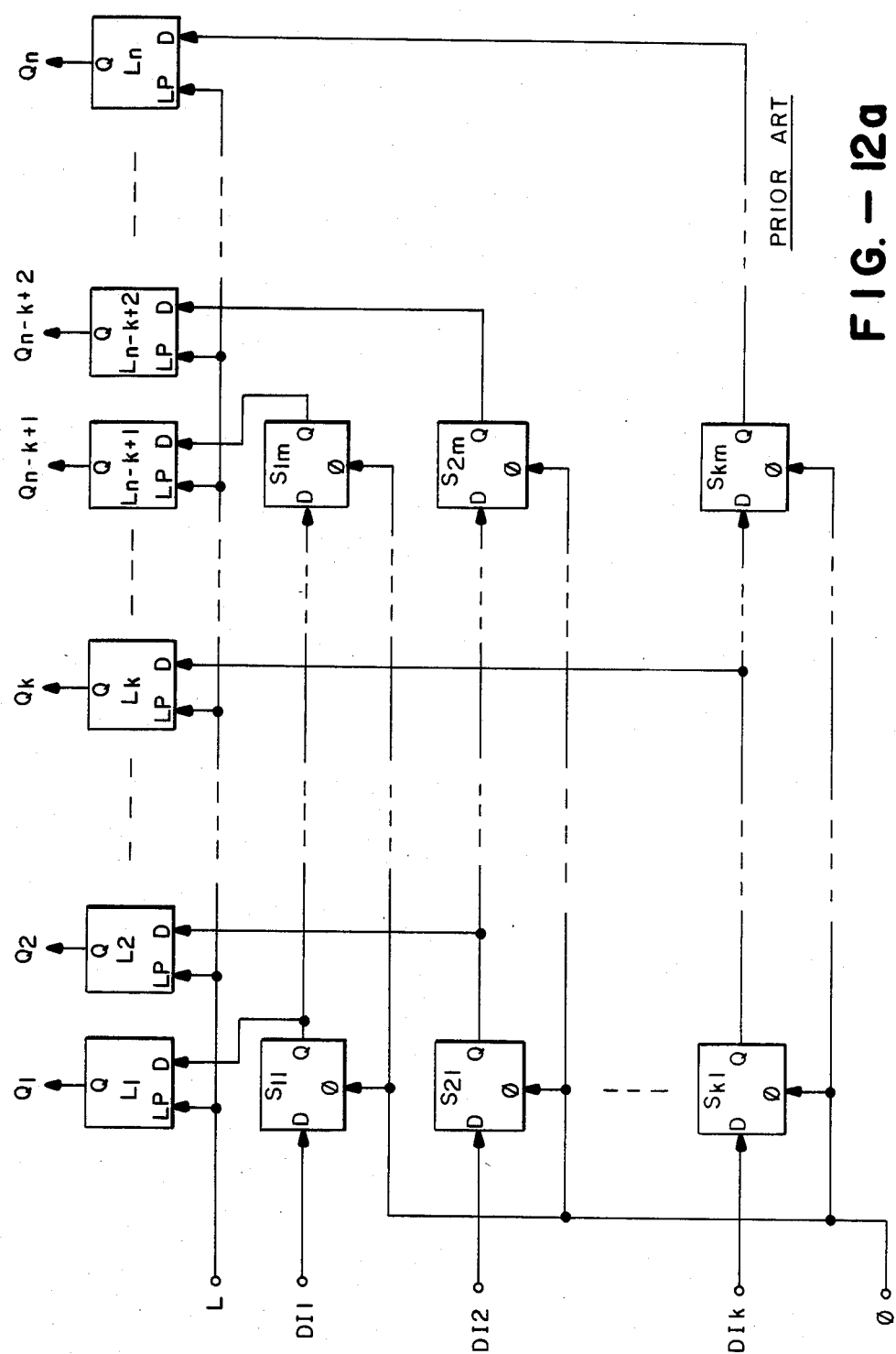

FIG. 12(a) and FIG. 12(b) are respectively a block diagram and a timing chart of a conventional serial-to-parallel converter circuit.

FIG. 1(a) is a block diagram of a serial data transfer circuit according to an embodiment of the present invention and FIG. 1(b) is a timing chart for explaining the operation of this circuit. This circuit is adapted to output an inputted data signal IN by effecting a delay corresponding to n (=m×k) clock periods, and n cells are arrayed in k groups of m serially connected shift registers. The serially connected cells $S_{i1}$-$S_{im}$ (i=1-k) within each group are subjected to a common shift pulse $\phi_i$ (i=1-k) for the controlling of data transfer. Such shift pulses $\phi_i$ are formed from a standard clock $\phi$ by deriving every kth pulse corresponding to the group number of the shift registers. The timing chart of FIG. 1(b) shows an example where m=k=2.

Serial data signal IN is applied in common to the first-stage shift registers $S_{i1}$ (i=1−k) in k groups. In each of the groups, the given serial data signal is inputted to the shift registers by the shift pulse $\phi_i$. The inputted data signal is transferred sequentially through the cells within the group in synchronism with the shift pulses $\phi_i$ for that group.

The last-stage cells $S_{im}$ (i=1−k) of each group is connected to a transfer gate $T_i$ (i=1−k) for controlling the timing of data output. The other terminal of this transfer gate $T_i$ (i=1−k) is connected to a common point A to which a final transfer gate $T_0$ is connected. The output signal OUT is derived from the other terminal of this transfer gate $T_0$.

Inputted to the gates of these transfer gates $T_i$-$T_k$ are switching signals for controlling the data output. These switching signals are different from the shift pulses $\phi_i$ which drive the corresponding groups of cells $S_{i1}$-$S_{im}$. They may, for example, be $\phi_{i+1}$, or the shift pulse delayed by one clock pulse, and signals outputted from the last-stage cells $S_{im}$ in synchronism with the shift pulse $\phi_i$ are drawn to A. An inversion signal $\bar{\phi}$ of the clock pulse $\phi$ is inputted as switching signal to the transfer gate $T_0$ connected to A, and the signals drawn to A from the shift registers of individual groups are taken out from the output terminal as a serial data signal.

In summary, the data signals which have shifted through the groups of cells appear at A sequentially through the transfer gates $T_1$-$T_k$ by means of the shift pulses $\phi_1$-$\phi_k$ and the input data signal IN is outputted through the transfer gate $T_0$ as a signal delayed by n clock pulse periods. The frequency of the shift pulse which operates the individual cells of this circuit is 1/k of the frequency in the case of the conventional circuit of FIG. 8(a) described above.

Figure 2A:
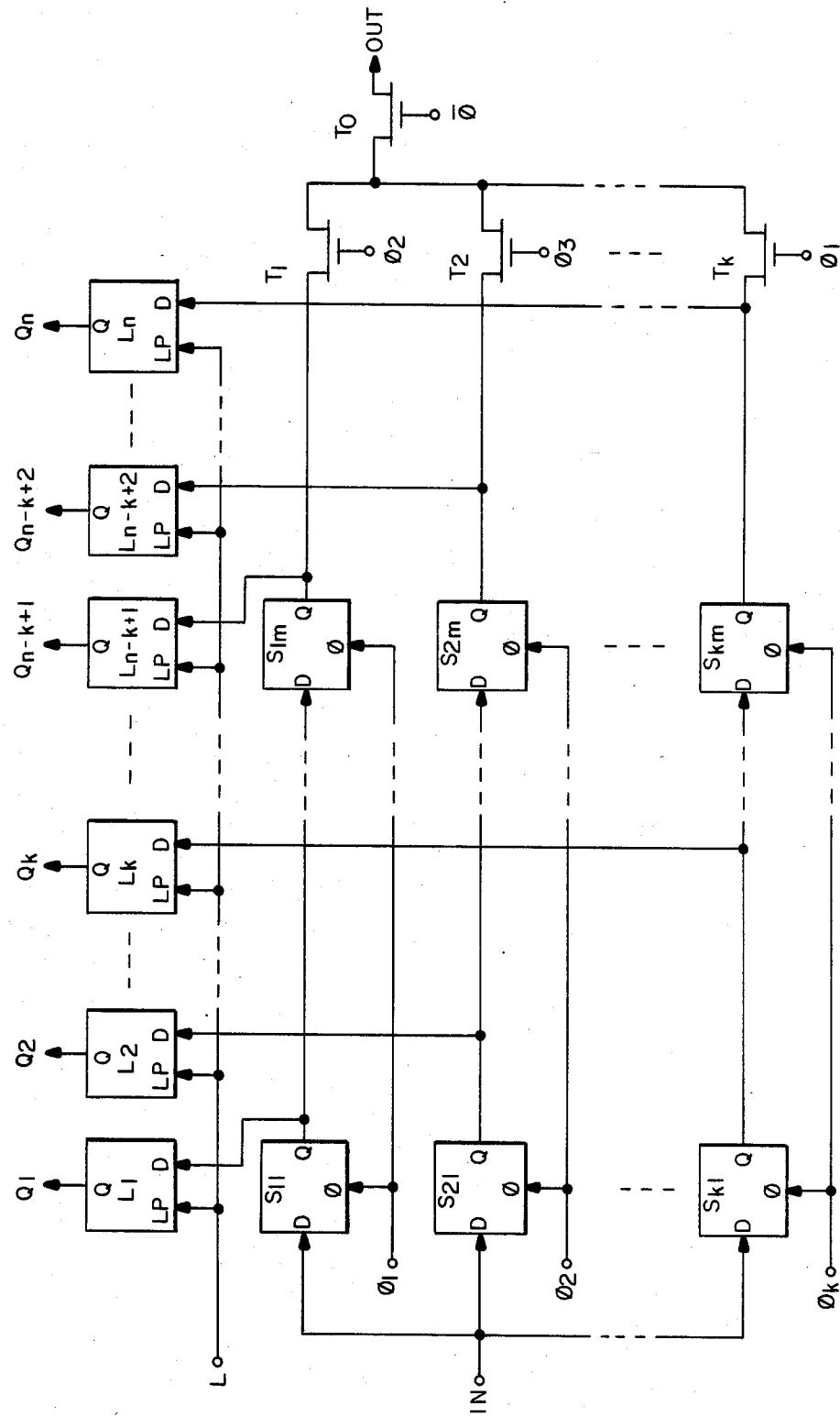

FIG. 2(a) and FIG. 2(b) are respectively a block diagram and a timing chart according to another embodiment of the present invention. This embodiment is the same as the previous embodiment regarding the inputting and shifting of serial data but latch circuits $L_{k(j-1)+i}$ are connected to the output terminals of the individual cells $S_{ij}$ (i=1−k, j=1−m). After n (=m×k) data signals have been inputted, the outputs from the individual cells are latched to the n latch circuits $L_1$-$L_n$ by a latch pulse L and taken out as signals $Q_1$-$Q_n$. By this embodiment, too, the inversion frequency of each cell becomes 1/k compared to the conventional circuit. The same conclusion is obtained if synchronism is effected with the rising of the clock signals. In summary, serial data signals are transferred through a circuit wherein the inversion frequency of each cell is reduced because timing is controlled by the shifting operation of the cells. If the cells are made of CMOS transistors, in particular, this results in reduction in power consumption.

FIG. 3(a) is a block circuit diagram according to still another embodiment of the present invention and FIG. 3(b) is a timing chart for explaining the operation of this circuit. In addition to cells $S_1$-$S_n$ connected serially for the transfer of serial input data signal X, there is an (n+1)st cell $S_{n+1}$ connected to the last-stage cell $S_n$ for receiving the output signal therefrom. The output signal Q from this cell $S_{n+1}$ is taken out as the count completion signal Y.

The second cell $S_2$ in this series is provided with a preset terminal and is adapted to be controlled by a first reset signal $R_1$ (preset function). The third through nth cells $S_3$-$S_n$ are each provided with a reset terminal and are adapted to be controlled by the aforementioned first reset signal $R_1$ (reset function). The additional (n+1)st cell $S_{n+1}$ is provided with a reset terminal and is adapted to reset the count completion signal Y by a second reset signal $R_2$. Serial data signal X is inputted from the input terminal of the first cell $S_1$ and it is transferred sequentially in synchronism with a shift clock $\phi$ as in a conventional data transfer circuit.

Next, the automatic counting function of this circuit will be explained. As the second reset signal $R_2$ and the first reset signal $R_1$ are sequentially inputted in synchronism with the shift clock $\phi$, not only is the count content of the (n+1)st cell $S_{n+1}$ reset but also the third through (n+1)st cells $S_3$-$S_{n+1}$ are reset, or set to "0" and the second cell $S_2$ is preset, or set to "1". After this reset operation, the (n+1) shift registers $S_1$-$S_{n+1}$ receive a shift clock pulse $\phi$ and the first cell $S_1$ takes in the serial data signal X and then shifts it in synchronism with the shift clock $\phi$. Simultaneously with this shifting, the data signals which were set in the second through (n+1)st cells $S_2$-$S_{n+1}$ at the aforementioned reset time are also shifted. After n data signals are sequentially inputted, "1" is set for the first time in the (n+1)st cells $S_{n+1}$ since the aforementioned resetting process by the second reset signal $R_2$. This is how it is detected that n data signals have been taken in, or that the shift clock $\phi$ has been counted n times. In other words, the detection of output signal Q from the (n+1)st cell as the count completion signal Y indicates that n data signals have been taken in by using the cells for data transfer or n shift clock pulses $\phi$. When the count completion signal Y is detected, the shift clock $\phi$ is kept inactive and input of data into cells after the (n+1)st signal becomes forbidden. In the circuit described above, the set and reset functions of the shift registers may be interchanged.

Figure 4:
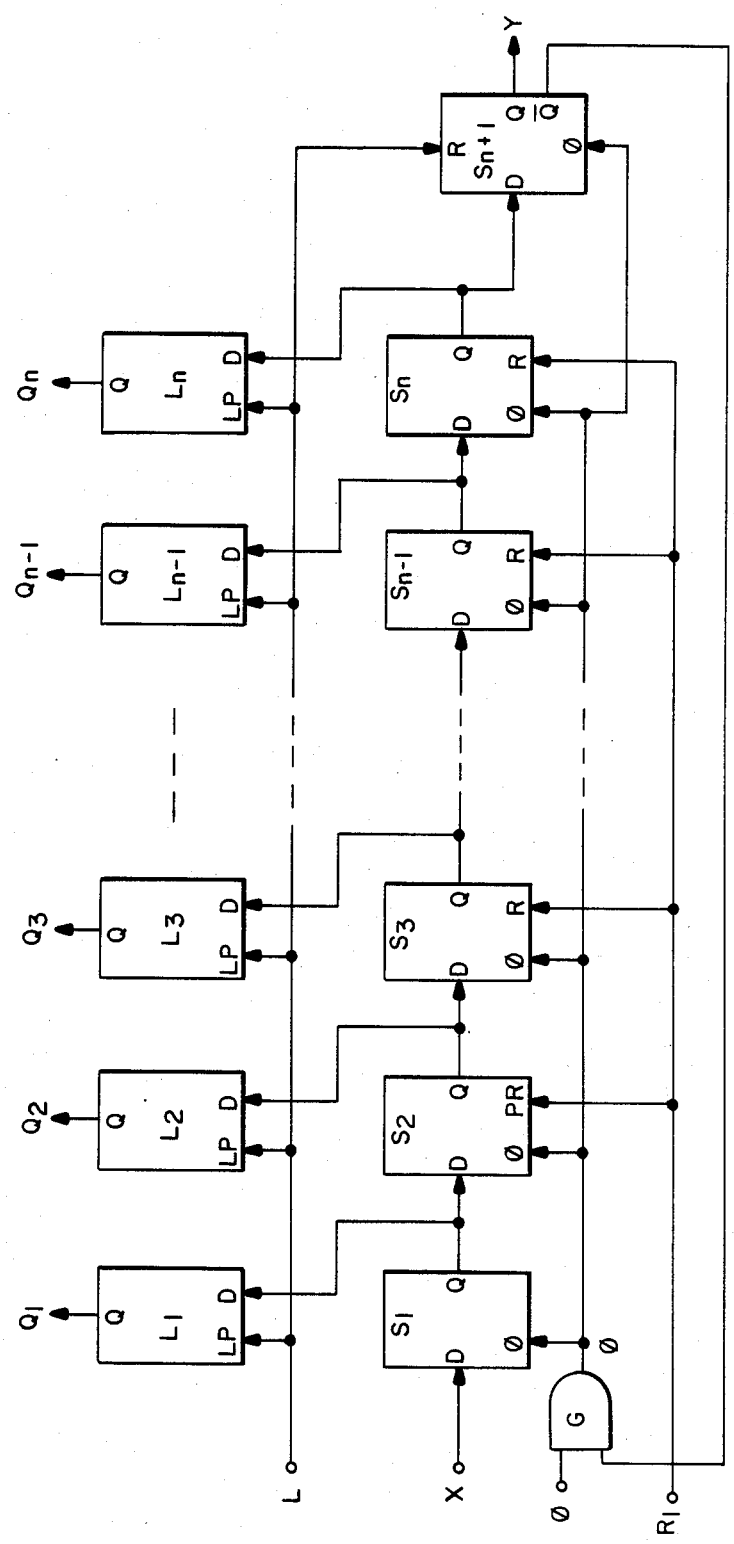
FIG. 4 is a block circuit diagram according to a further embodiment of the present invention.

FIG. 4 is a block circuit diagram according to a still further embodiment of the present invention whereby a serial data signal inputted to cells can be outputted in parallel. As in the previous embodiment, an (n+1)st cell $S_{n+1}$ is added to cells $S_1$-$S_n$ and the count completion signal Y is outputted from the (n+1)st cell $S_{n+1}$. Latch circuits $L_1$-$L_n$ are connected to the output terminals of the first through nth cells $S_1$-$S_n$, respectively, in order to take out a serially inputted data signal X in parallel and they latch the contents of the corresponding cells by a latch pulse L and take out output signals $Q_1$-$Q_n$. The latch pulse L is inputted not only to the latch circuits $L_1$-$L_n$ but also to the reset terminal of the (n+1)st cell $S_{n+1}$ as the second reset signal of the preceding embodiment. According to this embodiment, there is an AND gate G provided in order to keep the counting action by the cells in an inactive state by a count completion signal Y. The output $\bar{Q}$ from the (n+1)st cell $S_{n+1}$ is inputted to regulate the input of the shift clock $\phi$.

FIG. 5 is a block circuit diagram according to a still further embodiment which includes a decoder and latch circuit W for inputting outputs from all cells $S_1$-$S_{n+1}$. Similarly to the preceding embodiments, counting is effected when a serial data signal X is inputted and all or a part of the outputs from the cells $S_1$-$S_n$ is inputted to the circuit W for decoding after the counting is completed. As a result, k decoded outputs are formed and output signals $Q_1$-$Q_k$ are taken out by the count completion signal Y or an appropriate latch signal.

FIG. 6(a) is a block diagram showing an example of application of the present invention. It is a circuit formed by longitudinally connecting a plurality of unit circuits $C_i$ (i=1−m), each containing a serial data transfer circuit having the counting function of the preceding embodiments. In other words, each unit circuit $C_i$ comprises, as shown in FIG. 6(b), a serial data transfer circuit A which contains (n+1) serially connected cells as shown above, a control circuit B for inputting various control signals such as a reset signal to the data transfer circuit A, and an RS flip-flop $F_1$ and a D flip-flop $F_2$ to which the count completion signal Y from the data transfer circuit is inputted. At the output end, there is provided an AND gate $G_0$ to which the inversion of the output from the flip-flop $F_2$ and the count completion signal Y are inputted. Such a unit circuit $C_i$ can be integrated, for example, as one semiconductor element. A data transfer circuit with a counting function having a plurality of unit circuits $C_1$-$C_m$ can thus be constructed by longitudinally connecting these integrated semiconductor elements.

The plurality of longitudinally connected unit circuits $C_i$ (i=1−m) is controlled by a common shift clock $\phi$ and a serial data signal is inputted to each of them in common. When an external chip-select signal T is inputted to an EI pin of the first unit circuit $C_1$, the signal T sets its RS flip-flop $F_1$ in a "set" state. As for the EI pins of the second and subsequent unit circuits $C_i$ (i=2−m), the signal $E_0$ outputted from the AND gate $G_0$ of the preceding unit circuit $C_{i-1}$ is given as external chip-select signal. In each unit circuit $C_i$, if there is a chip-select signal using the output signal $E_0$ from the preceding AND gate, the RS flip-flops $F_1$ of the unit circuits are set and the control circuit B becomes activated to take in the serial data signal X and the shift clock $\phi$. This is how shift registers in unit circuits effect counting and the RS flip-flop $F_1$ is reset after the completion of specified counting and the shift clock within the unit circuit stops its action. The count completion signal Y activates the D flip-flop $F_2$ and a pulse signal $E_0$ corresponding to one period of the shift clock $\phi$ is outputted through the AND gate $G_0$ as a chip-select signal to the succeeding unit circuit. Since the output pulse signal $E_0$ of the unit circuit $C_i$ is inputted to the EI pin of the next unit circuit $C_{i+1}$, a similar counting process takes place subsequently in the unit circuit $C_{i+1}$. After similar processes take place successively from the first unit circuit $C_1$ to the last unit circuit $C_m$, the entire process comes to an end. If the circuits like the aforementioned shift registers are formed by CMOS transistors, only one of the m unit circuits with data input will be operating. This means that the active period is shorter and that the rate of power consumption is reduced. In summary, the present invention makes it possible to make better use of the shift registers for data transfer and to improve the counting capability and the functions of serial data transfer circuits.

FIG. 7(a) shows a block circuit diagram according to still another embodiment of the present invention and FIG. 7(b) and FIG. 7(c) are timing charts for explaining this embodiment. There are n (=k×m) cells $S_{11}$-$S_{km}$ arranged in k groups of m cells each. Latch circuits $L_1$-$L_n$ are individually connected to each of the output terminals of cells $S_{11}$-$S_{km}$ and parallel output signals $Q_1$-$Q_n$ are taken out of these latch circuits $L_1$-$L_n$ as will be explained below.

There are mode changing switches A and B connected between the first-stage cell $S_{i1}$ (i=1−k) of each group and k-bit data input terminals $DI_1$-$KI_k$. The first mode changing switch A is connected between the first bit input terminal $DI_1$ and the first-stage cells $S_{i1}$ (i=2−k) of the second through kth groups for the purpose of inputting a data signal from the input terminal $DI_1$ simultaneously by a mode selection signal so that the input data signal from this 1-bit input terminal can be outputted after being subjected to a serial-to-parallel conversion. The second mode changing switch B is connected between the remaining input terminals $DI_2$-$DI_k$ and the first-stage cells $S_{i1}$ (i=2−k) of the second through kth groups so that a non-mode selection signal $\overline{M}$ will cause the data signals at the bit input terminals $DI_2$-$DI_k$ to be inputted to the first-stage cells $S_{i1}$ (i=2−k) of the corresponding groups.

The shift pulse for controlling the shifting processes of the cells is provided from a timing control circuit (not shown) and is switched according to the selected mode. More in detail, the timing control circuit not only outputs the standard clock $\phi$ but takes out every kth signal from the standard clock $\phi$ to form k shift pulses $\phi_1$-$\phi_k$ with sequentially varying phases and gives them to the cells according to the contents of the mode. When the first mode changing switch A is in a conductive state, the shift pulses $\phi_1$-$\phi_k$ are inputted simultaneously to the cells of the corresponding groups. When the second mode changing switch B is in a conductive state, the clock pulse $\phi$ is inputted to all cells in common.

When a mode selection signal M is given to the circuit structured as above, data signals can be inputted only through the input terminal $DI_1$ and are inputted to the first-stage cells $S_{11}$-$S_{1k}$ of all groups, divided timewise by the shift pulses $\phi_1$-$\phi_k$. Inside each group of cells, the inputted data signal is shifted successively through the cells in synchronism with the shift clock pulses $\phi_1$-$\phi_k$. After the signals are transferred to the last-stage cells $S_{1m}$-$S_{km}$, a latch pulse L causes all outputs from the cells to be latched to the latch circuits $L_1$-$L_n$ and outputted as output signals $Q_1$-$Q_n$. In short, a 1-bit serially inputed data sgnal is parallel-converted and outputted.

When a non-mode selection signal $\overline{M}$ is given, the k bits at the input terminals $DI_1$-$KI_k$ are inputted simultaneously to the corresponding cells of respective groups. Since the timing control circuit controls in this situation such that the shift pulse of each group will be in phase with the standard clock pulse $\phi$, the data signals inputted to the groups of cells are sequentially shifted in synchronism with the clock $\phi$. After the data signals have shifted to the last stage cells $S_{1m}$-$S_{km}$ of the groups, a latch pulse L causes the outputs from the cells to be latched to the corresponding latch circuits $L_1$-$L_n$ and outputted as output signals $Q_1$-$Q_n$. In other words, output signals are obtained by serial-to-parallel conversion of a k-bit input data signal.

In summary, this invention discloses the use of a switch circuit for switching data inputted according to mode selection so that shift registers can be used both as a 1-bit serial-to-parallel conversion circuit and as a k-bit input serial-to-parallel conversion circuit. In other words, the addition of a simple circuit can greatly enhance the capability of a circuit.

What is claimed is:

1. A power-saving serial data transfer circuit for outputting an inputted digital data signal through a plurality of serially connected shift register cells, comprising $n = m \times k$ cells in a plurality of k groups each containing a plurality of m serially connected cells, a digital data signal being adapted to be applied commonly to the first-stage cells of said groups and inputted in a timewise segmented sequence to said cells by shift pulses $\phi_i$, wherein $i = 1 - k$, with different phases, said inputted data signal being adapted to be shifted through said cells within the same groups and be inputted to the last-stage cells of said groups, said inputted data signal being further adapted to be outputted through a multiplexer means connected to said last-stage cells.

2. The serial data transfer circuit of claim 1 further comprising latch circuits individually coupled to said cells, each of said latch circuits being adapted to receive output signal from one of said cells coupled thereto, said circuit being adapted to output signals from said cells as $k \times m$ parallel data signals after $k \times m$ input data signals are received.

3. A serial data transfer circuit comprising n serially connected shift register cells, n being three or greater, said n cells being adapted to sequentially shift an input data signal, said transfer circuit further comprising an $(n+1)$st cell connected to the output terminal of the nth of said n serially connected cells, the second of said n serially connected cells being adapted to be preset by a reset signal, the third through nth of said n serially connected cells being adapted to be reset by said reset signal, said $(n+1)$st cell being adapted to be reset by said reset signal, the value of preset of said second cell being different from the reset value of said third through nth cells, said circuit being adapted to output counting by detecting the output from said $(n+1)$st cell.

4. The serial data transfer circuit of claim 3 further comprising latch circuits each connected to the output terminal of one of said cells, said n serially connected cells being adapted to output the contents thereof in parallel.

5. The serial data transfer circuit of claim 3 wherein the first of said n serially connected cells has no resetting capability.

6. A serial-to-parallel converter comprising
a plurality of k groups each of a plurality of m serially connected shift register cells,
latch circuits individually connected to the output terminals of said cells respectively for effecting an output in parallel,
a mode selection switch provided between said k data input terminals and respective first cells in said groups for inputting a k-bit input data signal to said cells of corresponding groups or inputting an input data signal of a selected bit to said first cells, and
a timing circuit for generating a timing signal for controlling the shifting of said input data signal through said cells.

* * * * *